United States Patent
Nogami et al.

(10) Patent No.: US 7,364,980 B2
(45) Date of Patent: Apr. 29, 2008

(54) MANUFACTURING METHOD OF SEMICONDUCTOR SUBSTRATE

(75) Inventors: Syouji Nogami, Tokyo (JP); Tomonori Yamaoka, Tokyo (JP); Shoichi Yamauchi, Aichi (JP); Hitoshi Yamaguchi, Aichi (JP); Takumi Shibata, Aichi (JP)

(73) Assignees: Sumco Corporation, Tokyo (JP); Denso Corporation, Aichi (JP)

( * ) Notice: Subject to any disclaimer, the term of this patent is extended or adjusted under 35 U.S.C. 154(b) by 36 days.

(21) Appl. No.: 11/539,441

(22) Filed: Oct. 6, 2006

(65) Prior Publication Data

US 2007/0082455 A1 Apr. 12, 2007

(30) Foreign Application Priority Data

Oct. 6, 2005 (JP) ............... 2005-293086

(51) Int. Cl.
*H01L 21/76* (2006.01)
(52) U.S. Cl. ............... 438/424; 438/427; 257/E21.102; 257/E21.129
(58) Field of Classification Search ........ 438/424, 438/427; 257/E21.102, E21.129
See application file for complete search history.

(56) References Cited

U.S. PATENT DOCUMENTS 6,555,891 B1 * 4/2003 Furukawa et al. .......... 257/505

* cited by examiner

*Primary Examiner*—Michael S. Lebentritt
*Assistant Examiner*—Mohsen Ahmadi
(74) *Attorney, Agent, or Firm*—Duane Morris LLP

(57) ABSTRACT

Closure at the opening of a trench with an epitaxial film is restrained, and thereby, filling morphology in the trenches is improved. A method for manufacturing a semiconductor substrate includes a step for growing an epitaxial layer 11 on the surface of a silicon substrate 13, a step of forming a trench 14 in this epitaxial layer, and a step of filling the inside of the trench 14 with the epitaxial film 12, wherein mixed gas made by mixing halogenoid gas into silicon source gas is circulated as material gas in filling the inside of the trench with the epitaxial film, and when the standard flow rate of the halogenoid gas is defined as $X$ slm and the film formation speed of the epitaxial film formed by the circulation of the silicon source gas is defined as $Y\mu m/min$, in the case when the aspect ratio of the trench is less than 10, an expression $Y<0.2X+0.10$ is satisfied, and in the case that the aspect ratio of the trench is between 10 and less than 20, an expression $Y<0.2X+0.05$ is satisfied, and in the case that the aspect ratio of the trench is 20 or more, an expression $Y<0.2X$ is satisfied.

20 Claims, 5 Drawing Sheets

MANUFACTURING METHOD OF SEMICONDUCTOR SUBSTRATE

BACKGROUND OF THE INVENTION

1. Field of the Invention

The present invention relates to a method for manufacturing a semiconductor substrate wherein an epitaxial film is grown in the inside of a trench and thereby the inside of the trench is filled with the epitaxial film.

2. Description of the Related Art

Japanese Examined Patent Application Publication No. 3485081 discloses a method for manufacturing a semiconductor substrate wherein an epitaxial film is filled in a trench and thereby a diffusion layer of a high aspect ratio is formed. Japanese Unexamined Patent Application Publication No. 2003-124464 discloses in a vertical type MOS transistor, a drift domain is made into a super junction structure (P/N column structure) and proposes a method of manufacturing a semiconductor substrate wherein an epitaxial film is filled in a trench and thereby a diffusion layer is formed.

However, when a void is generated in an epitaxial film filled in a trench, the problem arises that a breakdown occurs in the upper portion of the void and the withstand pressure decreases. Thus, the generation of the void in a filled epitaxial film deteriorates performance of the element. Specifically, it causes the decline of the withstand pressure of the above-mentioned super junction structure (P/N column structure), or the decline of the withstand pressure junction leak yield accompanying the generation of a crystal defect arising from a void, or a resist left in the portion of the void in the trench which leads to contamination in the process, or the like.

SUMMARY OF THE INVENTION

Accordingly, the present invention provides a method of manufacturing a semiconductor substrate that can restrain closure at the opening of a trench with an epitaxial film, and improve the filling morphology in the trench. More specifically, the present invention provides a method of manufacturing a semiconductor substrate which includes a step of growing an epitaxial layer 11 on the surface of a silicon substrate 13, a step of forming a trench 14 in this epitaxial layer 11, and a step of circulating a material gas and thereby growing the epitaxial film 12 in the inside of the trench 14 and filling the inside of the trench 14 with the epitaxial film 12, as shown in FIG. 1

DETAILED DESCRIPTION OF THE INVENTION

Figure 1:
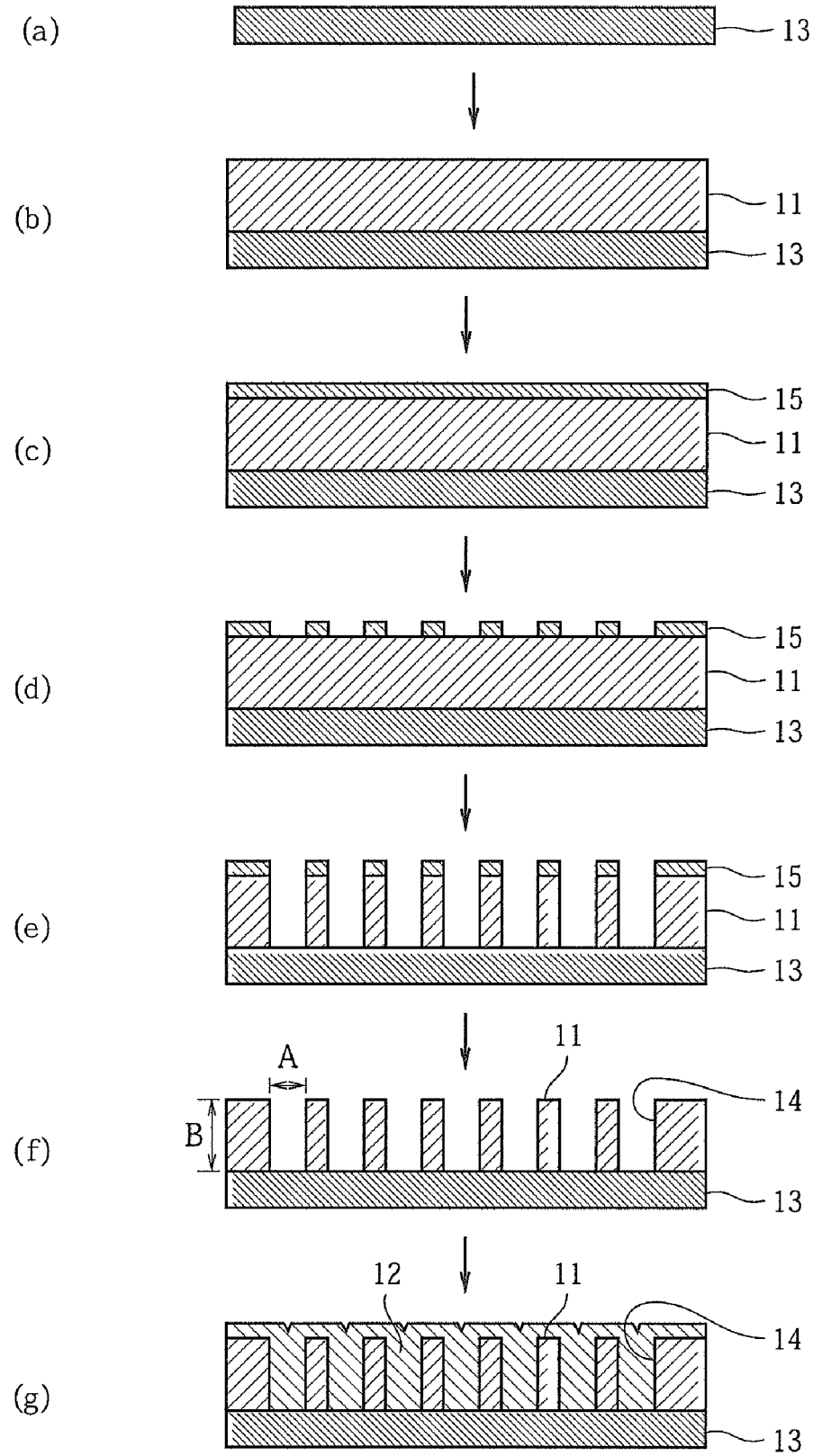
FIG. 1 is a flowchart showing a method for manufacturing a semiconductor substrate according to an embodiment of the present invention.

More specifically, and as set forth in Claim 1, the invention is characterized in that the aspect ratio expressed as the ratio (B/A) wherein B is the depth of the trench and A is the width of the trench 14 formed in the epitaxial layer 11 is less than 10, and a mixed gas made by mixing a halogenoid gas into a silicon source gas is circulated as a material gas at least in the final step of filling the inside of the trench 14 with the epitaxial film 12, and when the standard flow rate of the halogenoid gas is defined as Xslm (Standard Liters per Minute), and the film formation speed of the epitaxial film 12 formed by the circulation of the silicon source gas is defined as Yµm/min, the following expression (1) is satisfied.

$$Y<0.2X+0.10 \quad (1)$$

The invention according to claim 2 provides a method of manufacturing a semiconductor substrate including a step of growing an epitaxial layer 11 on the surface of a silicon substrate 13, a step of forming a trench 14 in this epitaxial layer 11, and a step of circulating a material gas and thereby growing the epitaxial film 12 in the inside of the trench 14 and filling the inside of the trench 14 with the epitaxial film 12.

The invention is characterized in that the aspect ratio of the trench 14 formed in the epitaxial layer 11 is between 10 and less than 20, and the mixed gas made by mixing the halogenoid gas into the silicon source gas is circulated as the material gas at least in the final step of filling the inside of the trench 14 with the epitaxial film 12, and when the standard flow rate of the halogenoid gas is defined as Xslm, and the film formation speed of the epitaxial film 12 formed by the circulation of the silicon source gas is defined as Yµm/min, the following expression (2) is satisfied.

$$Y<0.2X+0.05 \quad (2)$$

The invention according to claim 3 provides a method for manufacturing a semiconductor substrate including a step of growing an epitaxial layer 11 on the surface of a silicon substrate 13, a step of forming a trench 14 in this epitaxial layer 11, and a step of circulating a material gas and thereby growing the epitaxial film 12 in the inside of the trench 14 and filling the inside of the trench 14 with the epitaxial film 12.

The invention is characterized in that the aspect ratio of the trench 14 formed in the epitaxial layer 11 is 20 or more, and a mixed gas, made by mixing a halogenoid gas into a silicon source gas, is circulated as a material gas at least in the final step of filling the inside of the trench 14 with the epitaxial film 12, and when the standard flow rate of the halogenoid gas is defined as Xslm, and the film formation speed of the epitaxial film 12 formed by the circulation of the silicon source gas is defined as Yµm/min, the following expression (3) is satisfied.

$$Y<0.2X \quad (3)$$

According to the methods for manufacturing a semiconductor substrate described in claims 1 to 3, wherein a halogenoid gas is mixed into the material gas, the halogenoid gas functions as an etching gas, and the etching speed becomes faster at the opening of the trench 14 than in the inside of the trench 14. As a result, closing of the opening of the trench 14 with the epitaxial film 12 is restrained, and it is possible to fill the inside of the trench 14 with the epitaxial film 12 without causing voids in the film inside of trench 14.

Further, by satisfying the above-mentioned expressions (1) to (3), it is possible to fill the inside of the trench 14 with the epitaxial film 12 precisely without causing voids in the inside of the trench 14, and accordingly, it is possible to improve the filling morphology of the epitaxial film 12 into the trench 14 more precisely than was previously possible.

The invention according to claim 4 is as described in any one of claims 1 to 3, wherein the halogenoid gas is a gas selected from the group consisting of hydrogen chloride, chlorine, fluoride, chlorine trifluoride, hydrogen fluoride, and hydrogen bromide.

In the method for manufacturing a semiconductor substrate described in claim 4, it is possible to attain the etching action in the opening of the trench 14 precisely, and to effectively restrain the closure at the opening of the trench 14 by the epitaxial film 12 until the trench completely fills up with the film.

The invention according to claim 5 relates to the inventions described in any one of claims 1 to 4, wherein the source gas is selected from the group consisting of silane, disilane, dichlorosilane, trichlorosilane, and silicon tetrachloride.

In the method for manufacturing a semiconductor substrate described in claim 5, it is possible to control the rate of reaction under preferable conditions for hotter crystallinity, and restrain the crystallinity of the epitaxial film 12 formed from deteriorating.

In the method for manufacturing a semiconductor substrate according to the present invention, a mixed gas made by mixing halogenoid gas into silicon source gas is circulated as a material gas at least in the final step of filling the inside of the trench with the epitaxial film, and accordingly, the halogenoid gas functions as an etching gas, and the etching speed thereof becomes faster at the opening of the trench than in the inside of the trench. Thereby, the closure at the opening of the trench with the epitaxial film is restrained, and it is possible to fill the inside of the trench with the epitaxial film without causing voids in the film inside of the trench.

Herein, when the standard flow rate of the halogenoid gas is defined as Xslm, and the film formation speed of the epitaxial film 12 formed by the circulation of silicon source gas is defined as Yμm/min, in the case where the aspect ratio of the trench is less than 10, it is required that the following expression (1) is satisfied, and in the case where the aspect ratio of the trench is between 10 and less than 20, it is required that the following expression (2) is satisfied, and in the case where the aspect ratio of the trench is 20 or more, it is required that the following expression (3) is satisfied.

$$Y<0.2X+0.10 \quad (1)$$

$$Y<0.2X+0.05 \quad (2)$$

$$Y<0.2X \quad (3)$$

In the present invention, by satisfying the above-mentioned expressions (1) to (3), it is possible to fill the inside of the trench with the epitaxial film precisely without causing voids in the inside of the trench, and accordingly, it is possible to improve the filling morphology of the epitaxial film into the trench more precisely than before.

In this case, when the halogenoid gas is any one of hydrogen chloride, chlorine, fluoride, chlorine trifluoride, hydrogen fluoride, and hydrogen bromide, it is possible to attain the etching action in the opening of the trench precisely, and to effectively restrain the closure at the opening of the trench with the epitaxial film, and when the source gas is any one of silane, disilane, dichlorosilane, trichlorosilane, and silicon tetrachloride, it is possible to control the rate of reaction under preferable conditions for hotter crystallinity, and restrain the crystallinity of the epitaxial film formed from being deteriorated.

Preferred embodiments according to the present invention are described in more details with reference to the attached drawings hereinafter.

First, as shown in FIG. 1, as a semiconductor substrate, an N$^+$ type silicon substrate 13 is prepared, and an epitaxial layer 11 is formed on the surface of this silicon substrate 13. This epitaxial film 11 is partially etched and removed, and plural columnar epitaxial layers 11 are formed at a predetermined interval on the surface of the silicon substrate 13 respectively, and an epitaxial film 12 is filled in the trenches 14 between plural epitaxial layers 11. The silicon substrate 13 is an N+ type silicon single crystal substrate doped with impurities, such as, phosphor, arsenic, antimony, and the like, and the epitaxial layer 11 is an N type silicon single crystal layer doped with impurities, such as, phosphor, arsenic, antimony, and the like, and the epitaxial film 12 is made of a P type silicon single crystal doped with impurities, such as, boron, gallium, indium, and the like.

The method for manufacturing a semiconductor device with the present invention is as follows with reference to the drawings:

First, as shown in FIG. 1(a), an N$^+$ type silicon substrate 13 is prepared, and as shown in FIG. 1(b), an N type epitaxial layer 11 is formed thereon. More specifically, while silane gas as material gas is supplied onto the surface of the silicon substrate 13, the epitaxial layer 11 is grown at the temperature range of 400 to 1200° C. by a vapor phase growth method. Then, as shown in FIG. 1(c), a silicon oxide film 15 is formed on the N type epitaxial layer 11, and as shown in FIG. 1(d), this silicon oxide film 15 is patterned into a specified shape so as to obtain specified trenches. Using this patterned silicon oxide film 15 as a mask, anisotropic etching (RIE: Reactive Ion Etching), or, wet etching with an alkaline anisotropic etching solution (KOH, TMAH, and the like) is performed onto the N type epitaxial layer 11, and as shown in FIG. 1(e), trenches 14 having a predetermined aspect ratio are formed. Thereafter, as shown in FIG. 1(f), the silicon oxide film 15 used as a mask is removed. Thus, on the surface of this silicon substrate 13, the plural columnar epitaxial layers 11 are formed at a predetermined interval respectively, and trenches 14 are formed in between the plural epitaxial layers 11 respectively.

And, as shown in FIG. 1(g), while the material gas is supplied onto the epitaxial layers 11 including the inside surfaces of the trenches 14, an epitaxial film 12 is formed at a temperature range of 400 to 1150° C. by the vapor phase growth method, and the insides of the trenches 14 are filled with the epitaxial film 12. In the process for filling the insides of the trenches 14 with the epitaxial film 12, at least in the last process thereof, the mixed gas of a silicon source gas and a halogenoid gas is used as the material gas to be supplied for the film formation of the epitaxial film 12.

More specifically, as the silicon source gas, any one of silane ($SiH_4$), disilane ($Si_2H_6$), dichlorosilane ($SiH_2Cl_2$), trichlorosilane ($SiHCl_3$), and silicon tetrachloride ($SiCl_4$) is used. In particular, it is preferable to use any one of dichlorosilane ($SiH_2Cl_2$), trichlorosilane ($SiHCl_3$), and silicon tetrachloride ($SiCl_4$) as the silicon source gas. As the halogenoid gas, it is preferable to use one of hydrogen chloride (HCl), chlorine ($Cl_2$), fluoride ($F_2$), chlorine trifluoride ($ClF_3$), hydrogen fluoride (HF), and hydrogen bromide (HBr), and in particular, it is preferable to use hydrogen chloride (HCl).

Figure 2:
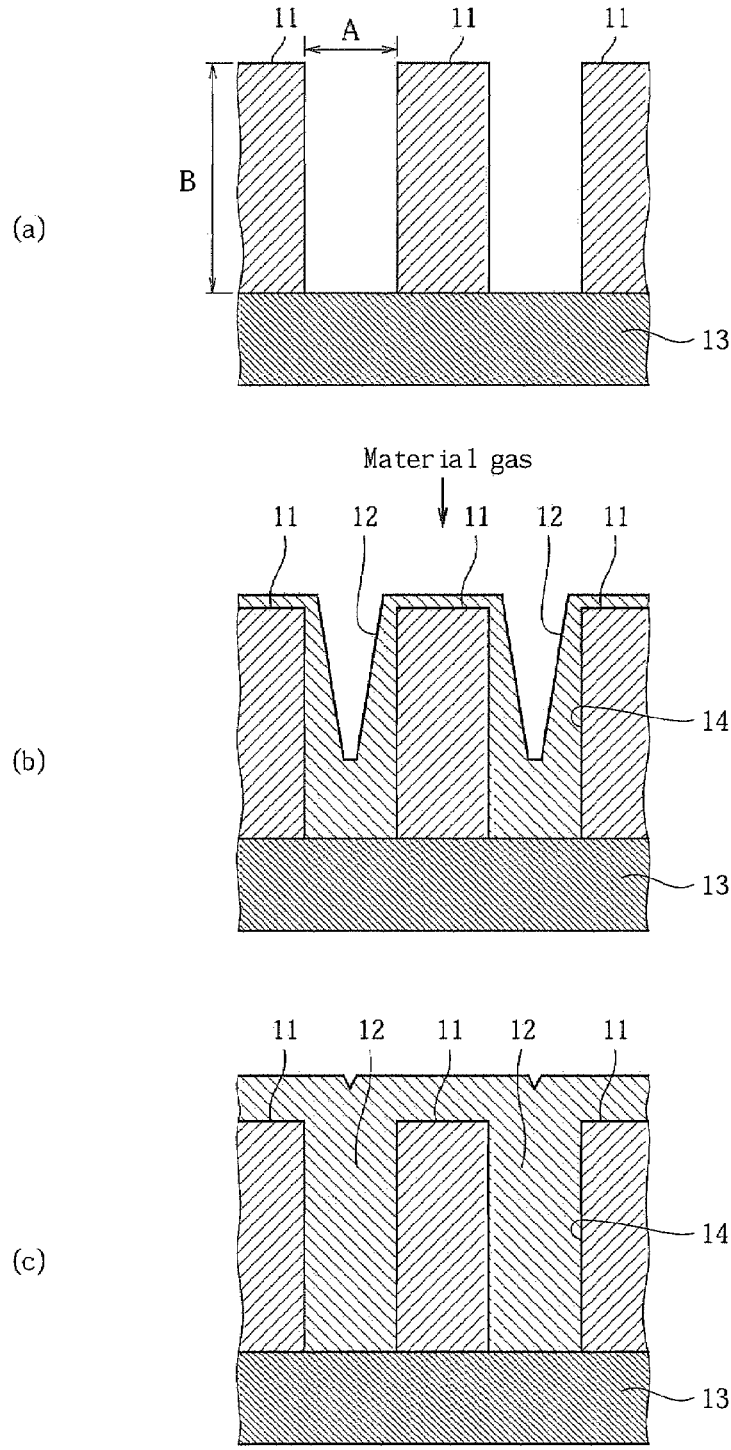
FIG. 2 is a figure showing a step wherein an epitaxial film is formed.

When the mixed gas of a silicon source gas and a halogenoid gas is supplied as the material gas, the halogenoid gas thereof functions as an etching gas, and the supply of etching gas is rate-controlled, and the etching speed becomes faster at the opening of the trench 14 than in the inside of the trench 14. In other words, as shown in FIG. 2(*a*), when the trench 14 is formed in the epitaxial layer 11 of the surface of the silicon substrate 13, and the material gas is supplied thereinto and the epitaxial film 12 is grown, as shown in FIG. 2B, the etching speed becomes faster at the opening of the trench 14 than in the inside of the trench 14. If this is viewed from the viewpoint of the growth speed of the epitaxial film 12, the growth speed becomes faster in the inside of the trench 14, and becomes slower at the opening of the trench 14. This is because the etching reaction by the halogenoid is more efficient at the opening of the trench 14 than in the inside of the trench 14, and the action of this halogenoid gas participates also in the decomposition reaction of the silicon source gas and makes the reaction mechanism more complicated, and thereby facilitating the control of the reaction rate. Accordingly, the growth speed at the opening of the trench 14 becomes slower than that at the inside of the trench 14, and with regard to the epitaxial film 12 on the side surfaces of the trench 14, the film thickness at the opening of the trench 14 becomes smaller than that at the bottom of the trench 14, and as shown in FIG. 2(*c*), and it is possible to fill the inside of the trench with the epitaxial film 12, without causing voids in the inside of the trench 14.

When the standard flow rate of the halogenoid gas is defined as Xslm, and the film formation speed of the epitaxial film 12 formed by the circulation of the silicon source gas is defined as Yμm/min, the method of manufacturing a semiconductor substrate according to the present invention is characterized in that, in the case that the aspect ratio of the trench 14 formed in the epitaxial layer 11 is less than 10, the following expression (1) is satisfied.

$$Y<0.2X+0.10 \quad (1)$$

Further, the method for manufacturing a semiconductor substrate according to the present invention is characterized in that, in the case that the aspect ratio of the trench 14 formed in the epitaxial layer 11 is between 10 and less than 20, the following expression (2) is satisfied.

$$Y<0.2X+0.05 \quad (2)$$

Furthermore, the method for manufacturing a semiconductor substrate according to the present invention is characterized in that, in the case that the aspect ratio of the trench 14 formed in the epitaxial layer 11 is 20 or more, the following expression (3) is satisfied. However, in the case when the aspect ratio is 20 or more, it is preferable that the standard flow rate of the halogenoid gas is limited to 0.1 slm (Standard Liter per Minute) or more. This is because, if the standard flow rate of the halogenoid gas is less than 0.1 slm, the film formation speed of the epitaxial film 12 declines remarkably, which leads to the decrease of the industrial production of the number of semiconductor substrates.

$$Y<0.2X \quad (3)$$

The above relation expressions (1) to (3) show that the smaller the flow rate of the halogenoid gas is, or the higher the aspect ratio of the trench 14 is, the lower the growth speed has to be controlled. That is, although the film formation speed of the epitaxial film 12 in the inside of the trench 14 is based on the circulation amount of the silicon source gas contained in the material gas, whether the film thickness of the epitaxial film 12 on the side surfaces of the trench 14 becomes small at the opening or not depends upon the standard flow rate of the halogenoid gas contained in the material gas. Moreover, whether it is possible or not to fill the inside of the trench with the epitaxial film 12 without causing voids in the inside of the trench 14 is based partially on the aspect ratio (B/A) expressed with the depth B of the trench to the width A of the trench 14. Therefore, if these relations are made to satisfy the above-mentioned expressions (1) to (3), it is possible to precisely fill the epitaxial film 12 in the inside of the trench 14 without causing voids. Further, filling the epitaxial film 12 in the inside of the trench 14 without causing such voids makes it possible to secure the withstand pressure at the moment of applying reverse bias to the super junction structure (P/N column structure) and control the junction leak current, and to thereby improve the withstand pressure yield and the junction leak yield.

Meanwhile, it is preferable to form the epitaxial film 12 under the reaction rate-controlled conditions. In particular, when silane ($SiH_4$) or disilane ($Si_2H_6$) is used as the silicon source gas, the upper limit of film formation temperature is made at 950° C. When dichlorosilane ($SiH_2Cl_2$) is used as the silicon source gas, the upper limit of film formation temperature is made at 1100° C. When trichlorosilane ($SiHCl_3$) is used as the silicon source gas, the upper limit of film formation temperature is made at 1150° C. As the silicon source gas, when silicon tetrachloride ($SiCl_4$) is used, the upper limit of film formation temperature is made at 1200° C. Moreover, it is preferable that in the case that the film formation vacuum degree is in the range from normal pressure to 100 Pa, the lower limit of film formation temperature is made at 800° C., and in the case when the film formation vacuum degree is in the range from 100 to 1×10-5 Pa, the lower limit of film formation temperature is made at 600° C.

Moreover, although not illustrated, after the above formation, the epitaxial film 12 on the upper surface of the epitaxial layer 11 is polished, and the epitaxial layer 11 (N type silicon layer) is exposed. Thereby, a semiconductor substrate wherein P type domains and N type domains are arranged alternately in the transverse direction is obtained.

EXAMPLES

Next, examples according to the present invention are explained together with comparative examples.

First Example

The N+ type silicon substrate 13 was prepared, and the epitaxial layer 11 was grown thereon by a vapor growth method, and wet etching was carried out on the epitaxial layer 11, and, on the surface of the silicon substrate 13, predetermined columnar plural epitaxial layers 11 were formed respectively. Thereby, trenches 14 whose aspect ratio was 15 were formed in between the plural epitaxial layers 11. Thereafter, while the material gas was supplied onto the surface of the epitaxial layers 11 including the inside of the trench 14, the epitaxial layer 12 was grown by the vapor phase growth method, and the inside of the trench 14 was filled with the epitaxial film 12. As the material gas, a mixed gas of a silicon source gas and a halogenoid gas was used, and as the silicon source gas, dichlorosilane ($SiH_2Cl_2$) was used, and as the halogenoid gas, hydrogen chloride (HCl) was used. The film formation speed of the epitaxial film in this case and the standard flow rate of the hydrogen chloride (HCl) were changed, and plural semiconductor substrates were obtained wherein the inside of the trenches 14 was filled with the epitaxial film 12.

Figure 3:
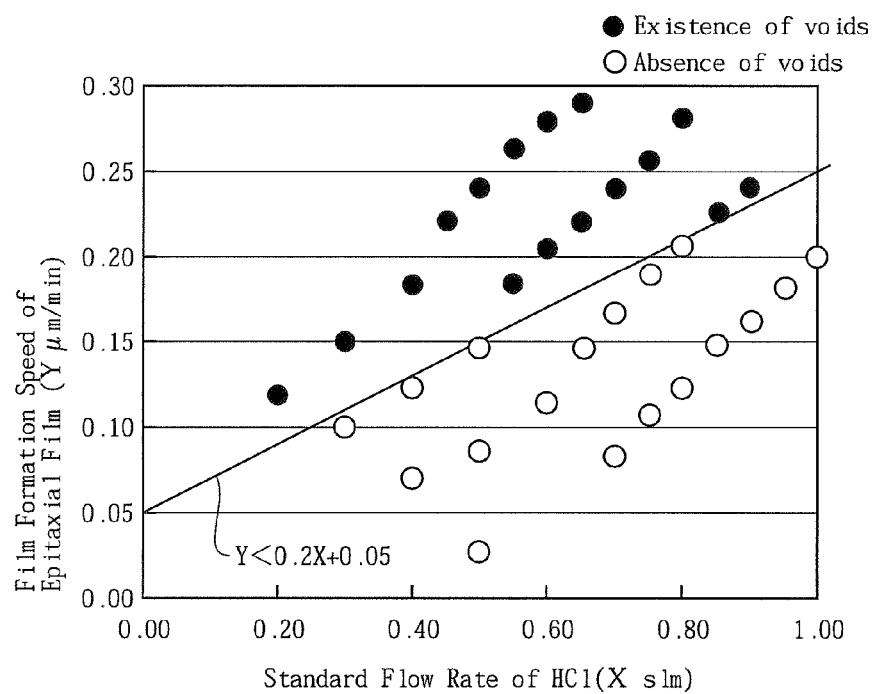
FIG. 3 is a figure showing the relation between the film formation speed of an epitaxial film and the standard flow rate of halogenoid gas in the case that the aspect ratio of the trench is 15.

Thereafter, these semiconductor substrates were cut respectively so that the vertical cross section of the epitaxial film 12 with which the inside of the trenches 14 was filled appeared, and the cross section was observed and thereby the existence or absence of voids in the epitaxial film 12 was investigated. These results are shown in FIG. 3.

Second Example

The trenches 14 were formed in the epitaxial layer 11 under the same conditions and procedures as those in the first example, with the exception that the aspect ratio of the trench 14 formed was 25, and the epitaxial film 12 was filled in the trenches 14 under the same conditions and procedures as those in the first example, and thereby plural semiconductor substrates were obtained.

Figure 5:
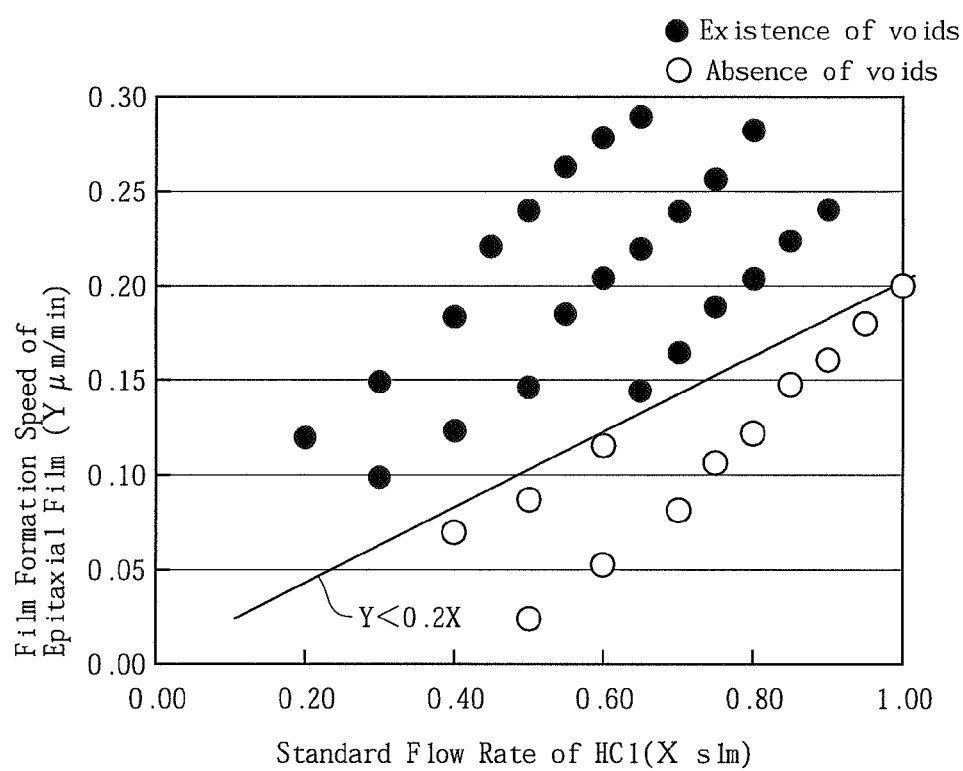
FIG. 5 is a figure showing the relation between the film formation speed of an epitaxial film and the standard flow rate of halogenoid gas in the case that the aspect ratio of the trench is 25.

These semiconductor substrates were cut respectively so that the vertical cross section of the epitaxial film 12 with which the inside of the trenches 14 was filled appeared, and the cross section was observed and thereby the existence or absence of voids in the epitaxial film 12 was investigated. These results are shown in FIG. 5.

Third Example

The trenches 14 were formed in the epitaxial layer 11 under the same conditions and procedures as those in the first example, with the exception that the aspect ratio of the trench 14 formed was 5, and the epitaxial film 12 was filled in the trenches 14 under the same conditions and procedures as those in the first example, and thereby plural semiconductor substrates were obtained.

These semiconductor substrates were cut respectively so that the vertical cross section of the epitaxial film 12 with which the inside of the trenches 14 was filled appeared, and the cross section was observed and thereby the existence or absence of voids in the epitaxial film 12 was investigated. These results are shown in FIG. 4.

Evaluation

Figure 4:
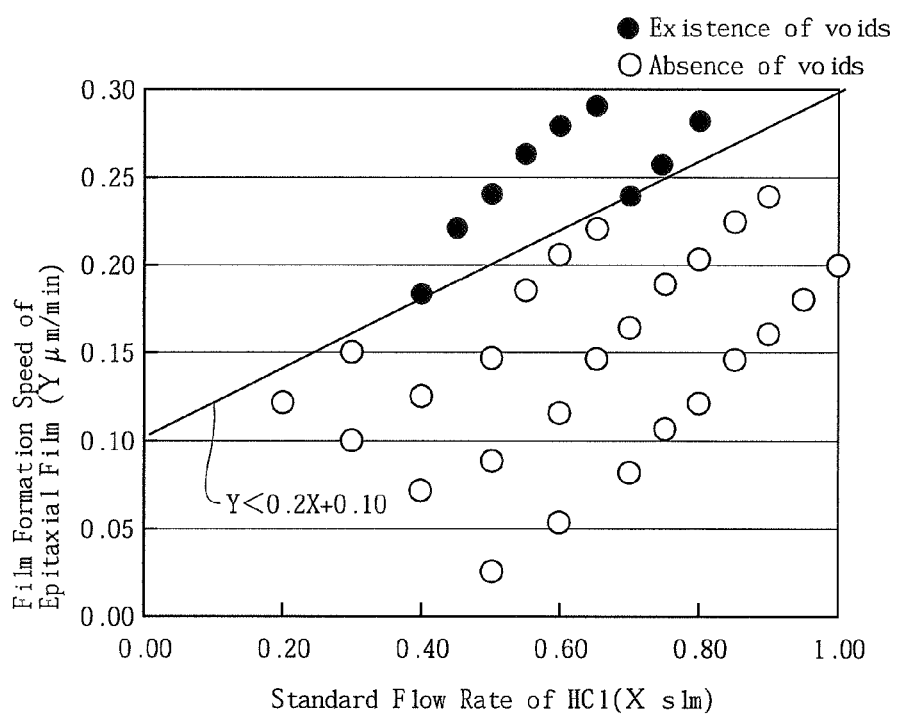
FIG. 4 is a figure showing the relation between the film formation speed of an epitaxial film and the standard flow rate of halogenoid gas in the case that the aspect ratio of the trench is 5.

As is apparent from FIG. 3 to FIG. 5, it is known that in the semiconductor substrates under the conditions that satisfy the above-mentioned expressions (1) to (3), no voids are generated in the epitaxial film 12 formed in the inside of the trenches 14. Therefore, in the present invention characterized in that the epitaxial film 12 is formed in the inside of the trenches 14 under the conditions that satisfy the above-mentioned expressions (1) to (3), it is apparently possible to fill the inside of the trenches 14 precisely with the epitaxial film 12, without causing voids.

What is claimed is:

1. A method for manufacturing a semiconductor substrate comprising growing an epitaxial layer (11) on the surface of a silicon substrate (13), forming a trench (14) in the epitaxial layer (11), and circulating a gas to grow the epitaxial film (12) in the inside of the trench (14) and filling the inside of the trench (14) with the epitaxial film (12), wherein the aspect ratio (B/A) of the trench (14) formed in the epitaxial layer (11) is less than 10 wherein A is the width of the trench (14), and B is the depth of the trench (14), the gas is a mixed gas prepared by mixing a halogenoid gas into a silicon source gas and the gas is circulated as a material gas at least in the final step of filling the inside of the trench (14) with the epitaxial film (12), and when the standard flow rate of the halogenoid gas is defined as Xslm, and the film formation speed of the epitaxial film (12) formed by the circulation of silicon source gas is defined as Yμm/min, the following expression (1) is satisfied:

$$Y < 0.2X + 0.10 \qquad (1).$$

2. A method for manufacturing a semiconductor substrate comprising growing an epitaxial layer (11) on the surface of a silicon substrate (13), forming a trench (14) in the epitaxial layer (11), and circulating a gas and to grow the epitaxial film (12) in the inside of the trench (14) and filling the inside of the trench (14) with the epitaxial film (12), wherein the aspect ratio (B/A) of the trench (14) formed in the epitaxial layer (11) is between 10 and less than 20 wherein A is the width of the trench (14), and B is the depth of the trench (14), the gas is prepared by mixing a halogenoid gas into a silicon source gas and the gas is circulated as a material gas at least in the final step of filling the inside of the trench (14) with the epitaxial film (12), and when the standard flow rate of the halogenoid gas is defined as Xslm, and the film formation speed of the epitaxial film (12) formed by the circulation of the silicon source gas is defined as Yμm/min, the following expression (2) is satisfied:

$$Y < 0.2X + 0.05 \qquad (2).$$

3. A method for manufacturing a semiconductor substrate comprising growing an epitaxial layer (11) on the surface of a silicon substrate (13), forming a trench (14) in the epitaxial layer (11), and circulating a gas to grow the epitaxial film (12) in the inside of the trench (14) and filling the inside of the trench (14) with the epitaxial film (12), wherein the aspect ratio (B/A) of the trench (14) formed in the epitaxial layer (11) is 20 or more wherein A is the width of the trench (14), and B is the depth of the trench (14), the gas is prepared by mixing a halogenoid gas into a silicon source gas and the gas is circulated as a material gas at least in the final step of filling the inside of the trench (14) with the epitaxial film (12), and when the standard flow rate of the halogenoid gas is defined as Xslm, and the film formation speed of the epitaxial film (12) formed by the circulation of the silicon source gas is defined as Yμm/min, the following expression (3) is satisfied:

$$Y < 0.2X \qquad (3)$$

wherein, A is the width of the trench (14), and B is the depth of the trench (14).

4. The method of claim 1 wherein the halogenoid gas is selected from the group consisting of hydrogen chloride, chlorine, fluoride, chlorine trifluoride, hydrogen fluoride, and hydrogen bromide.

5. The method of claim 2 wherein the halogenoid gas is selected form the group consisting of hydrogen chloride, chlorine, fluoride, chlorine trifluoride, hydrogen fluoride, and hydrogen bromide.

6. The method of claim 3 wherein the halogenoid gas is selected form the group consisting of hydrogen chloride, chlorine, fluoride, chlorine trifluoride, hydrogen fluoride, and hydrogen bromide.

7. The method of claim 1 wherein the source gas is selected from the group consisting of silane, disilane, dichlorosilane, trichlorosilane, and silicon tetrachloride.

8. The method of claim 2 wherein the source gas is selected from the group consisting of silane, disilane, dichlorosilane, trichlorosilane, and silicon tetrachloride.

9. The method of claim 3 wherein the source gas is selected from the group consisting of silane, disilane, dichlorosilane, trichlorosilane, and silicon tetrachloride.

10. The method of claim 4 wherein the source gas is selected from the group consisting of silane, disilane, dichlorosilane, trichlorosilane, and silicon tetrachloride.

11. The method of claim 1 wherein the epitaxial layer is formed at a temperature of from about 400 to 1200° C. using a vapor phase growth method.

12. The method of claim 3 wherein the standard flow rate of the halogenoid gas is limited to 0.1 slm.

13. A semiconductor substrate prepared by the method of claim 1.

14. A semiconductor substrate prepared by the method of claim 2.

15. A semiconductor substrate prepared by the method of claim 3.

16. A semiconductor substrate prepared by the method of claim 4.

17. A semiconductor substrate prepared by the method of claim 5.

18. A semiconductor substrate prepared by the method of claim 6.

19. A semiconductor substrate prepared by the method of claim 7.

20. A semiconductor substrate prepared by the method of claim 8.

* * * * *